US007385251B2

(12) United States Patent
Chang et al.

(10) Patent No.: US 7,385,251 B2
(45) Date of Patent: Jun. 10, 2008

(54) AREA-EFFICIENT GATED DIODE STRUCTURE AND METHOD OF FORMING SAME

(75) Inventors: Leland Chang, New York, NY (US); Robert H. Dennard, Croton-on-Hudson, NY (US); David M. Fried, Brewster, NY (US); Wing Kin Luk, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 11/334,170

(22) Filed: Jan. 18, 2006

(65) Prior Publication Data

US 2007/0164359 A1    Jul. 19, 2007

(51) Int. Cl.
*H01L 27/01* (2006.01)
*H01L 27/12* (2006.01)
*H01L 31/0392* (2006.01)

(52) U.S. Cl. .................. 257/347; 257/302; 257/328
(58) Field of Classification Search ............. 438/386, 438/391, 243–244, 268, 270; 257/347, 302, 257/304, 328–330, 332
See application file for complete search history.

(56) References Cited

U.S. PATENT DOCUMENTS 4,649,625 A * 3/1987 Lu ........................ 438/245
4,713,678 A * 12/1987 Womack et al. ............ 257/302
5,225,697 A * 7/1993 Malhi et al. ................ 257/302
6,265,278 B1 * 7/2001 Alsmeier et al. ........... 438/386

OTHER PUBLICATIONS

M. Yang et al., "High Performance CMOS Fabricated on Hybrid Substrate with Different Crystal Orientations," IEDM, 4 pages, 2003.

* cited by examiner

*Primary Examiner*—Chuong A. Luu
(74) *Attorney, Agent, or Firm*—Ryan, Mason & Lewis, LLP

(57) ABSTRACT

An area-efficient gated diode includes a semiconductor layer of a first conductivity type, an active region of a second conductivity type formed in the semiconductor layer proximate an upper surface of the semiconductor layer, and at least one trench electrode extending substantially vertically through the active region and at least partially into the semiconductor layer. A first terminal of the gated diode is electrically connected to the trench electrode, and at least a second terminal is electrically connected to the active region. The gated diode is operative in one of at least a first mode and a second mode as a function of a voltage potential applied between the first and second terminals. The first mode is characterized by the creation of an inversion layer in the semiconductor layer substantially surrounding the trench electrode. The gated diode has a first capacitance in the first mode and a second capacitance in the second mode, the first capacitance being substantially greater than the second capacitance.

1 Claim, 10 Drawing Sheets

CROSS SECTION

LAYOUT

- SOURCE/DRAIN
- TRENCH
- GATE
- ⊠ CONTACT
- ⸋ HOT BULK BOUNDARY

AREA-EFFICIENT GATED DIODE STRUCTURE AND METHOD OF FORMING SAME

FIELD OF THE INVENTION

The present invention relates to semiconductor devices and, more particularly, to gated diodes and techniques for the formation thereof.

BACKGROUND OF THE INVENTION

The voltage amplification characteristics of a gated diode are known to be desirable in the design of high performance and low voltage memory circuits. Area-efficient implementations of gated diode structures, however, have remained elusive, primarily because planar gated diode structures are generally required to be significantly large in order to achieve sufficient capacitance. Typically, the "on" capacitance of a gated diode, which may be defined as the capacitance associated with the device when it is forward biased, must be about five to ten times that of the total load capacitance connected to the gated diode. This requires a gate area of the diode to be about a few times that of a load transistor used in conjunction with the gated diode, which, especially in a densely packed circuit application (e.g., a memory cell), can result in significantly increased cost.

Two simple implementations of a gated diode structure are shown in FIG. 1, wherein the capacitance characteristics of the gated diode are based on a standard metal-oxide-semiconductor field-effect transistor (MOSFET) structure 100 having two source/drain regions 102, or on an MOS structure 150 having a single source/drain region. When a gate 104 of either of the MOS structures 100, 150 is biased below inversion, there will be a very small capacitance between first and second terminals (terminal 1 and terminal 2) of the structure. Inversion in a MOS device is typically defined as a change in carrier type obtained by the application of an external voltage to the device. Inversion creates free carriers which cause the drain current in the MOS device. The small capacitance associated with a device biased below inversion consists primarily of parasitic capacitances, such as, for example, overlap capacitance between an edge of the gate 104 and a given source/drain region 102 of the MOS device. When the gate 104 is biased above inversion, a large capacitance (e.g., gate oxide inversion capacitance) is seen between the two terminals of the gated diode, due primarily to the formation of an inversion layer along a channel 106 in the MOS structure 100, 150.

The total capacitance associated with the MOS structure depends primarily on the planar layout area, which is, for large gated diodes, dominated by a gate-over-active area. In order to increase the capacitance, either a width (W) or a length (L) of the gate 104 in the gated diode must be increased. Increasing the length is preferred since the inversion capacitance increases while the overlap capacitance remains substantially unchanged. The length of the gated diode is limited, however, by a transit time required for a carrier to travel from the source/drain region 102 to a middle of the channel 106 (usually several hundred nanometers (nm), depending on the design).

The MOS structure may either contain both source and drain contacts tied together to form the second terminal of the gated diode, as in the case of MOSFET structure 100, or just one of the two contacts, as in the case of MOS structure 150. Using both source and drain contacts reduces carrier transit time by a factor of two, which may be important in certain high-speed applications. Using symmetric contacts also makes the capacitance of the MOSFET structure more insensitive to overlay errors, as the layout is symmetric between the source and drain. However, such a design undesirably requires a larger layout area and doubles the overlap capacitance.

Accordingly, there is a need for an improved gated diode structure, and techniques for the formation thereof, that does not suffer from one or more of the problems exhibited by conventional gated diode structures.

SUMMARY OF THE INVENTION

The present invention meets the above-noted need by providing, in an illustrative embodiment thereof, a trench gated diode structure having enhanced area efficiency over existing planar gated diode designs. By extending a gate electrode of the gated diode in a substantially vertical dimension, a capacitance of the gated diode can be beneficially increased without significantly increasing a planar layout area of the gated diode.

In accordance with one aspect of the invention, an area-efficient gated diode includes a semiconductor layer of a first conductivity type, an active region of a second conductivity type formed in the semiconductor layer proximate an upper surface of the semiconductor layer, and at least one trench electrode extending substantially vertically through the active region and at least partially into the semiconductor layer. A first terminal of the gated diode is electrically connected to the trench electrode, and at least a second terminal is electrically connected to the active region. The gated diode is operative in one of at least a first mode and a second mode as a function of a voltage potential applied between the first and second terminals. The first mode is characterized by the creation of an inversion layer in the semiconductor layer substantially surrounding the trench electrode. The gated diode has a first capacitance in the first mode and a second capacitance in the second mode, the first capacitance being substantially greater than the second capacitance.

The trench electrode, in a preferred embodiment, includes a trench filled with an electrically conductive material. A thin insulating layer lining sidewalls and a bottom of the trench provides electrical isolation between the conductive material and the active region and semiconductor layer. No buried plate contact is required, as the operation of the gated diode relies primarily on the formation of the inversion layer around the trench electrode. The capacitance provided by this structure combines the planar layout area with the trench perimeter sidewall. This device can be easily integrated with a MOSFET device, commonly employed to switch the gated diode, using standard complementary metal-oxide semiconductor (CMOS) technologies.

In accordance with another embodiment of the invention, an integrated circuit includes at least one gated diode. The gated diode comprises a semiconductor layer of a first conductivity type and an active region of a second conductivity type formed in the semiconductor layer proximate an upper surface of the semiconductor layer. The gated diode further include at least one trench electrode extending substantially vertically through the active region and at least partially into the semiconductor layer. A first terminal is electrically connected to the trench electrode and at least a second terminal is electrically connected to the active region. The gated diode is operative in one of at least a first mode and a second mode as a function of a voltage potential applied between the first and second terminals. The first mode is characterized by the creation of an inversion layer in the semiconductor layer substantially surrounding the trench electrode. The gated diode has a first capacitance in the first mode and a second capacitance in the second mode, the first capacitance being substantially greater than the second capacitance.

In accordance with a third embodiment of the invention, a method for forming a gated diode includes the steps of: forming an active region of a first conductivity type in a semiconductor layer of a second conductivity type, the active region being formed proximate an upper surface of the semiconductor layer; forming at least one trench electrode extending substantially vertically through the active region and at least partially into the semiconductor layer; forming a first terminal electrically connected to the trench electrode; and forming at least a second terminal electrically connected to the active region. The gated diode is operative in one of at least a first mode and a second mode as a function of a voltage potential applied between the first and second terminals, the first mode being characterized by the creation of an inversion layer in the semiconductor layer substantially surrounding the trench electrode. The gated diode has a first capacitance in the first mode and a second capacitance in the second mode, the first capacitance being substantially greater than the second capacitance.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative trench gated diode structures. It should be understood, however, that the present invention is not limited to this or any other particular semiconductor structure. Rather, the invention is more generally applicable to techniques for beneficially increasing a capacitance of a gated diode without significantly increasing a layout area of the gated diode. Although implementations of the present invention are described herein with specific reference to a CMOS fabrication process, it is to be understood that the invention is not limited to such a fabrication process, and that other suitable fabrication processes (e.g., bipolar, BiCMOS, etc.), may be similarly employed, as will be apparent to those skilled in the art.

Figure 1:
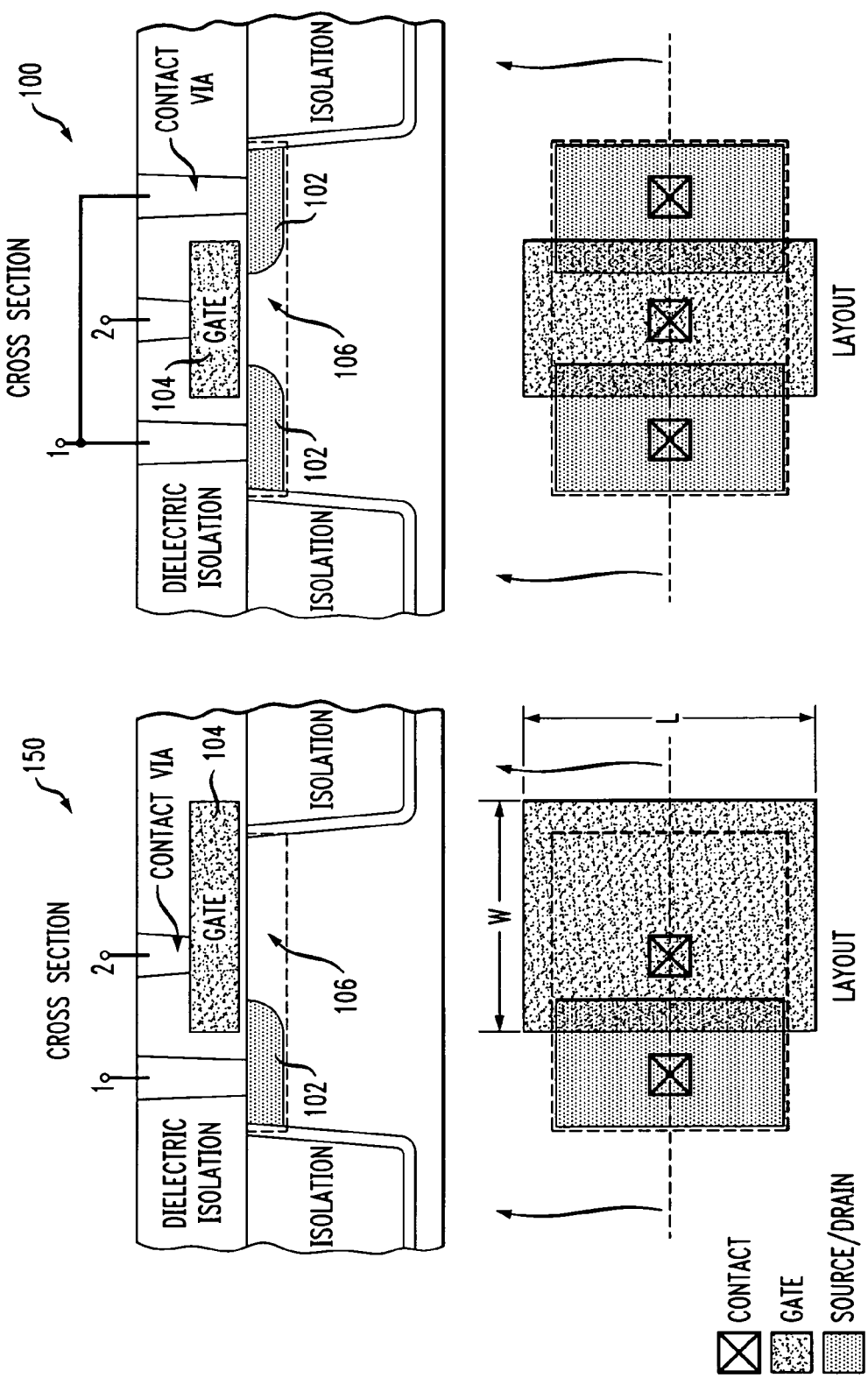
FIG. 1 is a cross-sectional view and corresponding top plan view illustrating two conventional gated diode arrangements.
Figure 2:
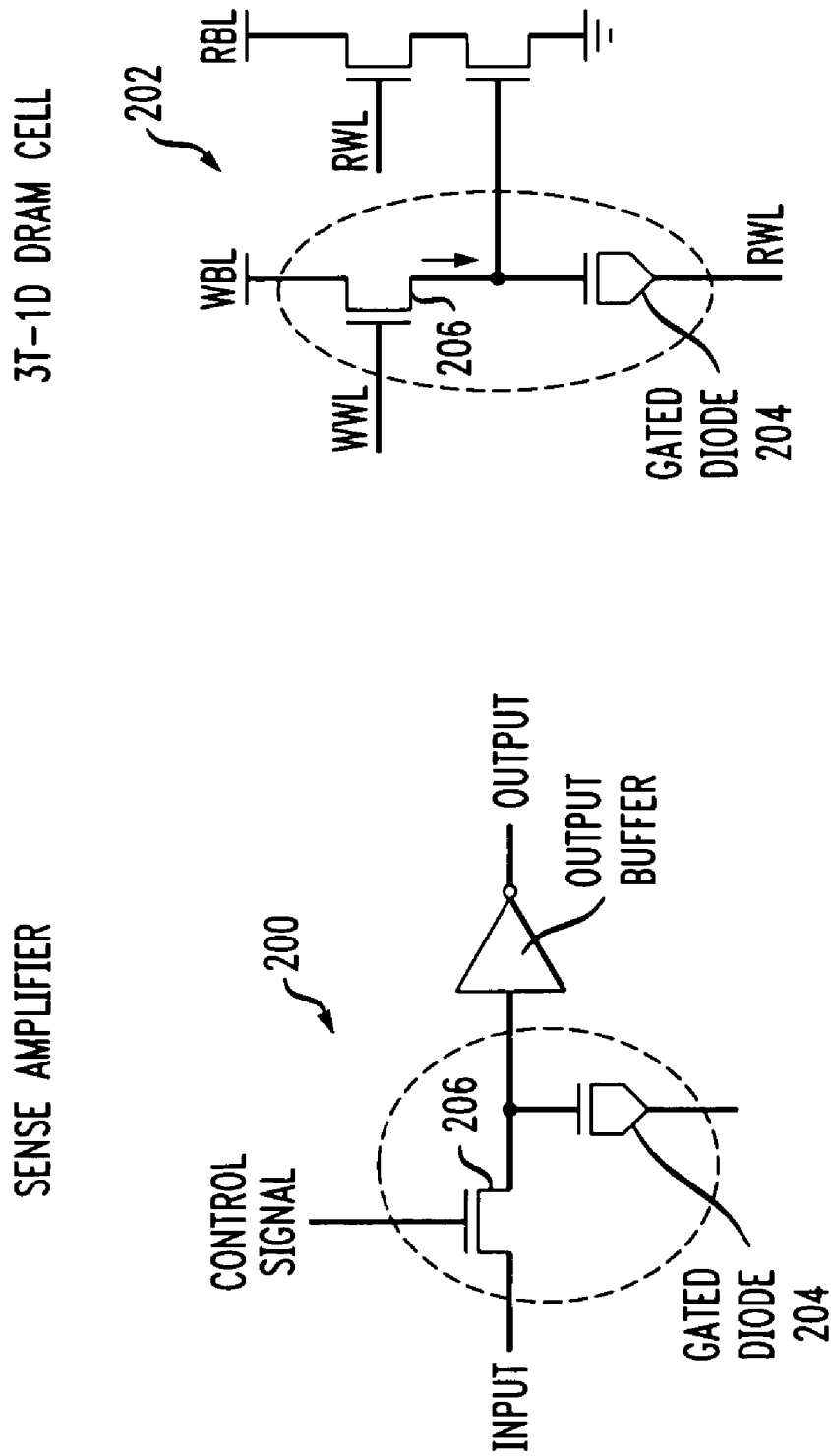
FIG. 2 is a schematic diagram depicting illustrative gated diode circuit applications in which the techniques of the present invention may be employed.

As previously stated, an advantage of a gated diode is that it is particularly well suited for use in high performance and low voltage circuit applications, such as, for example, sense amplifiers and memory cell architectures, although gated diodes are not limited to these applications. FIG. 2 shows an illustrative sense amplifier circuit 200 and a three-transistor one-diode (3T-1D) dynamic random access memory (DRAM) cell 202, each employing a gated diode 204. In these illustrative gated diode applications, the gated diode is typically connected to a series MOSFET device 206, as shown.

In a simple gated diode configuration, the capacitance characteristics of the gated diode may be based on a standard MOSFET device. When a gate of the MOSFET device is biased above inversion, a large capacitance (e.g., gate oxide inversion capacitance) is seen between the two terminals (e.g., anode and cathode), due primarily to the formation of an inversion layer along a channel in the MOSFET device. The total capacitance associated with the MOSFET device depends primarily on the planar layout area, which is, for large gated diodes, dominated by a gate-over-active area. Conventionally, in order to increase the capacitance of the gated diode, either a width or a length of the gated diode must be increased.

Figure 3:
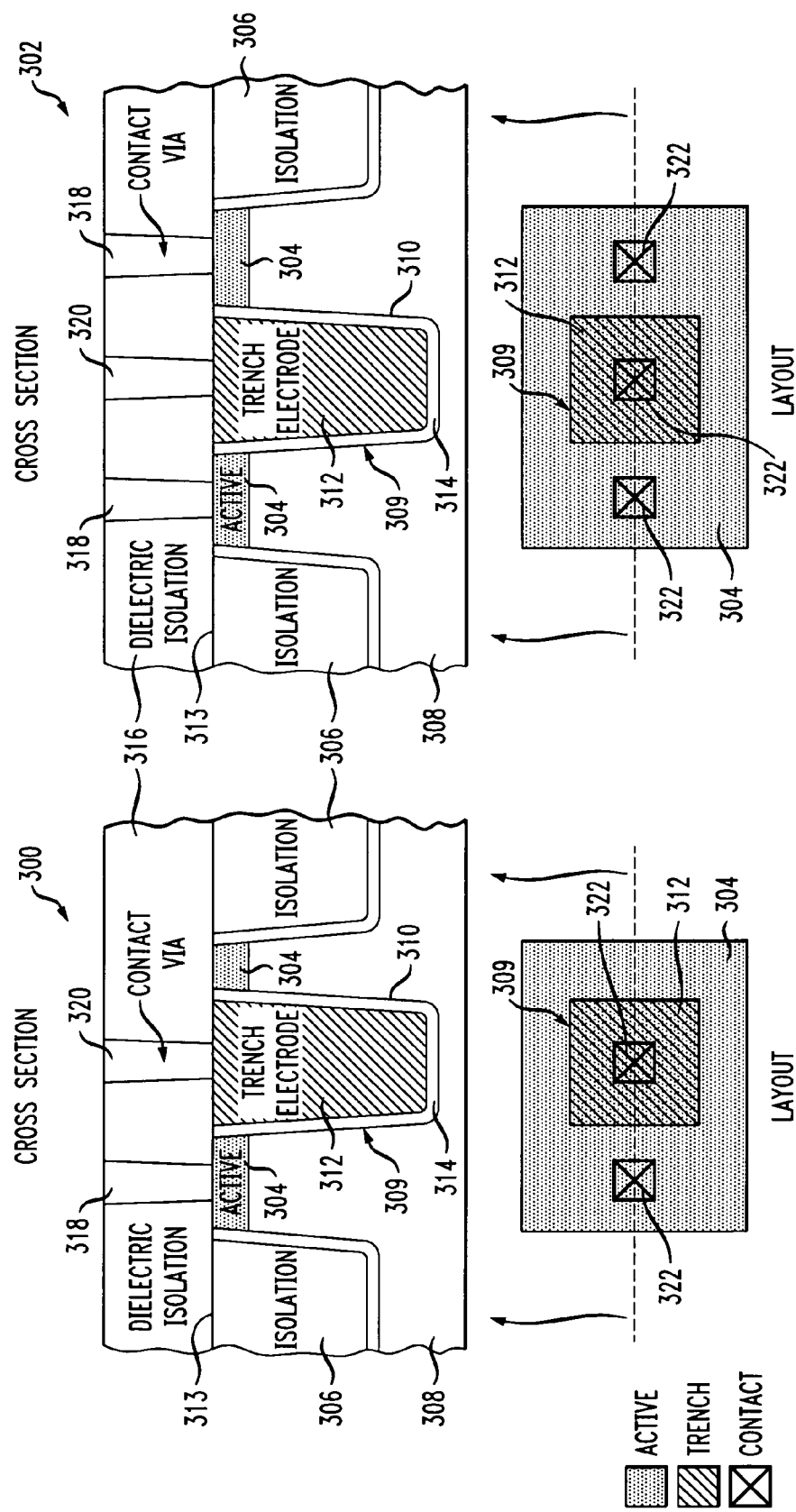
FIG. 3 is a cross-sectional view and corresponding top plan view illustrating two trench gated diode structures, formed in accordance with one embodiment of the present invention.

FIG. 3 are cross-sectional views (Cross Section) and corresponding top plan views (Layout) of at least a portion of exemplary area-efficient gated diode structures, 300 and 302, formed in accordance with one embodiment of the present invention. It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual integrated circuit device.

Each gated diode structure 300, 302 includes a semiconductor substrate 308. At least one active region 304 is formed in the substrate 308 proximate to an upper surface 313 of the substrate such as by a conventional implant and diffusion process. The active region 304, which is commonly defined as a region of the substrate in which active components may be formed, is preferably doped, such as by a conventional implant step, with an impurity of a known concentration level to selectively change the conductivity of the substrate as desired. The active region 304 may have a conductivity type (e.g., n-type) associated therewith which is opposite a conductivity type (e.g., p-type) of the substrate 308. Depending on the circuit application, p- and n-type diodes may be employed. The substrate impurity concentration (or type) is not critical, since the device will essentially function sufficiently so long as the active region is not heavily doped like a traditional source/drain region of an MOS device. In an illustrative embodiment of the invention, the active region can be lightly to moderately doped with an impurity type which is opposite to that of the source/drain region (e.g. light p-type active region vs. n+ source/drain region).

The substrate 308 is commonly formed of single-crystal silicon (e.g., having a <100> or <111> crystal orientation), although suitable alternative materials may also be used, such as, but not limited to, germanium (Ge), gallium arsenide (GaAs), etc. Additionally, the substrate 308 is preferably modified by adding an impurity or dopant to change the conductivity of the material (e.g., n-type or p-type). In a preferred embodiment of the invention, the substrate 308 is of p-type conductivity and may thus be referred to as a p-substrate. A p-substrate may be formed by adding a p-type impurity or dopant (e.g., boron) of a desired concentration (e.g., about $5\times10^{18}$ to about $5\times10^{19}$ atoms per cubic centimeter) to the substrate material, such as by a diffusion or implant step, to change the conductivity of the material as desired. An epitaxial layer (not shown) may be formed on at least a portion of the substrate 308. The thickness of the epitaxial layer, if used, is typically much less than a thickness of the substrate 308 (e.g., on the order of microns), although the present invention is not limited to any particular thickness(es) of the epitaxial layer and/or substrate. All concepts described herein are applicable to both n+ and p+ gated diodes.

The term "semiconductor layer" as may be used herein refers to any semiconductor material upon which and/or in which other materials may be formed. The semiconductor layer may comprise a single layer, such as, for example, substrate 308, or it may comprise multiple layers, such as, for example, the substrate and epitaxial layer. A semiconductor wafer comprises the substrate, with or without the epitaxial layer, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

In accordance with an important aspect of the invention, the gated diode structures 300, 302 are advantageously made more area-efficient by extending a capacitor of the gated diode in a third dimension (e.g., vertically). This can be achieved, for example, by forming a trench electrode 309 in the substrate 308. A vertical depth of the trench electrode 309 in the substrate 308 is preferably about several thousand Angstroms, although the trench electrode is not limited to any particular depth value. The trench electrode 309 comprises a trench 310 formed through the active region 304 and at least partially into the substrate 308. The trench 310 is then filled with an electrically conductive material 312, such as, for example, polysilicon, metal (e.g., aluminum), etc, using, for example, a standard deposition or trench fill process. The conductive material 312 in the trench 310 is preferably electrically isolated from the substrate 308 and active region 304 by a thin insulating layer 314, which may comprise a dielectric material (e.g., silicon dioxide, silicon nitride, etc.), formed on sidewalls and a bottom of the trench. Insulating layer 314 may be referred to as a liner. The sidewalls and bottom form an interior perimeter edge of the trench 310. The insulating layer 314 may be formed on the sidewalls and bottom of the trench 310 using, for example, a conventional oxidation process. In the process of forming the gated diode structures, the isolating dielectric is preferably formed before the trench electrode deposition.

A dielectric isolation layer 316 is preferably formed on the upper surface 313 of the substrate 308. The dielectric isolation layer 316 may comprise silicon dioxide, or an alternative insulating material (e.g., silicon nitride, etc.). A standard oxidation or deposition process may be used to form the dielectric isolation layer 316. Contact vias, 318 and 320, may be formed through the dielectric isolation layer 316 for providing an electrical connection to the active region 304 and trench electrode 309, respectively, of the gated diode 300, 302. Contact vias 318, 320 may be formed by creating respective openings through the dielectric isolation layer 316, such as by reactive ion etching (RIE) or an alternative etching process, and filling the openings with a metal (e.g., aluminum, gold, etc.), or an alternative conductive material. Contact via(s) 318 is(are) electrically connected to the active region 304 while contact via 320 is electrically connected to trench electrode 309. Contacts 322 may be used to connect the contact vias to electrical conductors (not shown) for electrically connecting the gated diode to other circuit elements which may be formed on the substrate or other semiconductor structures (e.g., bonding pad).

The trench electrode 309 functions as a gate in the gated diode structure 300, 302 and forms an inversion layer surrounding the sidewalls and bottom of the trench during normal operation of the gated diode. This inversion layer is formed when a voltage potential applied to the trench electrode is greater than a threshold of the device, which is related to a difference between a workfunction of the trench electrode 309 and a workfunction of the active region 304, as well as a thickness of the trench insulating layer 314 and the doping concentration of the active region. The capacitance associated with the gated diode in this state will be a function of a sum of the respective capacitances associated with the sidewalls and bottom of trench 310. When the voltage potential applied to the trench electrode is lower than the threshold of the device, the inversion layer does not form, and the capacitance associated with the gated diode is simply the overlap capacitance, which is significantly smaller than the inversion capacitance. Thus, the gated diode structure is operative in one of at least two modes. In a first mode, corresponding to a high-capacitance mode, the voltage potential applied to the trench electrode of the gated diode is greater than the threshold voltage of the device, while in a second mode, corresponding to a low-capacitance mode, the applied voltage potential is less than the threshold voltage of the device.

The gated diode arrangement of the present invention can provide significantly more capacitance per unit area in comparison to a standard planar design. Furthermore, unlike the planar structure, multiple active region contacts can be placed in parallel in the trench gated diode structure without increasing an overlap capacitance of the gated diode. The carrier transit time of the trench gated diode, however, is unaffected by the contact scheme since the active region 304 surrounds an entire top portion of the trench electrode 309, as evident from the respective layouts. Alignment of the trench 310 itself is not critical (e.g., trench alignment does not significantly affect the capacitance value) as long as the trench is formed within the active region 304.

Isolation regions 306 are preferably formed in the substrate 308 surrounding the gated diode structure 300, 302, for electrically isolating the gated diode structure from other circuit elements and/or structures that may be formed on the same substrate 308. The isolation regions 306 preferably comprise an insulating material, such as, for example, silicon dioxide, silicon nitride, etc., and may be formed, for example, using a standard oxidation and/or oxide deposition process. Alternatively, isolation regions 306 can be formed by creating trenches or other openings in the substrate 308 and filling the trenches with an insulating material (e.g., silicon dioxide), such as by using a shallow trench isolation (STI) process.

Figure 4:
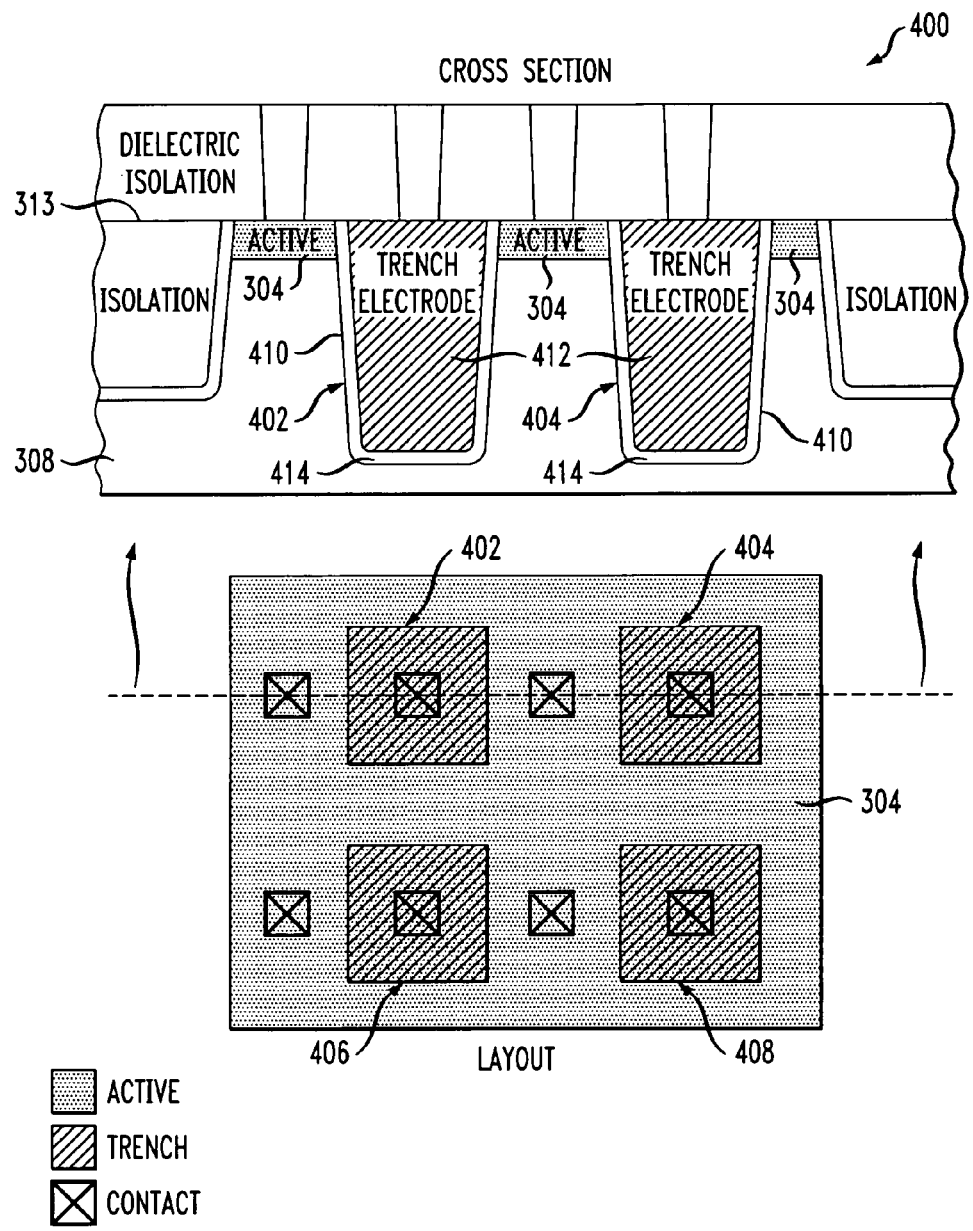
FIG. 4 is a cross-sectional view and corresponding top plan view illustrating a trench gated diode including multiple trenches, formed in accordance with an embodiment of the invention.

FIG. 4 is a cross-sectional view (Cross Section) and corresponding top plan view (Layout) depicting an exemplary gated diode structure 400, formed in accordance with another embodiment of the invention. Like the gated diode structures 300, 302 shown in FIG. 3 and described herein, gated diode 400 is formed as a trench gated device. In this embodiment, however, rather than comprising a single trench electrode, gated diode 400 comprises multiple trench electrodes 402, 404, 406 and 408, formed through active region 304 and at least partially into the substrate 308 to further increase the capacitance of the gated diode. Trench electrodes 402, 404, 406, 408 are preferably formed in a manner similar to that previously described in conjunction with the gated diode 300 of FIG. 3. Specifically, each trench electrode 402, 404, 406, 408 preferably comprises a corresponding trench 410 formed in the substrate 308 and filled with a conductive material 412. The conductive material 412 is separated from the active region 304 and substrate 308 by an insulating layer 414 formed on sidewalls and a bottom of the trench 410.

The trench electrodes 402, 404, 406, 408 are preferably formed in an array, although the placement of the trench electrodes in the gated diode structure 400 is not limited to the arrangement shown. As in the gated diodes 300, 302 depicted in FIG. 3, alignment of the trench 410 itself is not critical (e.g., trench alignment does not significantly affect the capacitance value) as long as the trench is formed within the active region 304. Although four trench electrodes are shown, the present invention is not limited to any particular number of trench electrodes. A vertical depth of the trench electrodes 402, 404, 406, 408 in the substrate 308 is not limited to any particular value. Moreover, it is not necessary that all trench electrodes 402, 404, 406, 408 are formed having the same depth.

Unlike deep trenches (e.g., typically on the order of several microns) used, for example, in DRAM applications, no implants or doping steps are needed around the bottom and sidewalls of the trench (or trenches) for electrical contact. Instead, operation of the gated diodes of the present invention relies primarily on the formation of an inversion layer around the trench electrode, as previously explained. Since the creation of the inversion layer can be selectively controlled by application of a voltage potential exceeding a threshold level, the gated diode structures formed in accordance with the present invention are operative in one of at least two capacitance modes. Although the depth of the trench electrode in the substrate is not limited to any particular value, the trench depth will be significantly less than that used in DRAM, since the capacitance needed in gated diode applications is typically more modest in comparison to the capacitance required for DRAM applications. The trench depth is limited, in at least one respect, by a time constant (e.g., carrier transit time) required for carriers to reach the bottom of the trench from the active region surrounding an upper portion of the trench proximate an upper surface 313 of the substrate 308.

Because this trench is shallow, patterning can be performed simultaneously using an STI definition process, a commonly employed CMOS isolation technique. This would result in trenches of substantially the same depth as the isolation regions 306 shown in FIG. 3. An STI liner could be used as the gated diode insulating layer 314, although a separate liner could allow for independent optimization of the trench and the gated diode. Separate fill steps, however, would be required to fill the gated diode trench with the conductive material 312 and to fill the STI isolation regions 306 with dielectric material.

Figure 5:
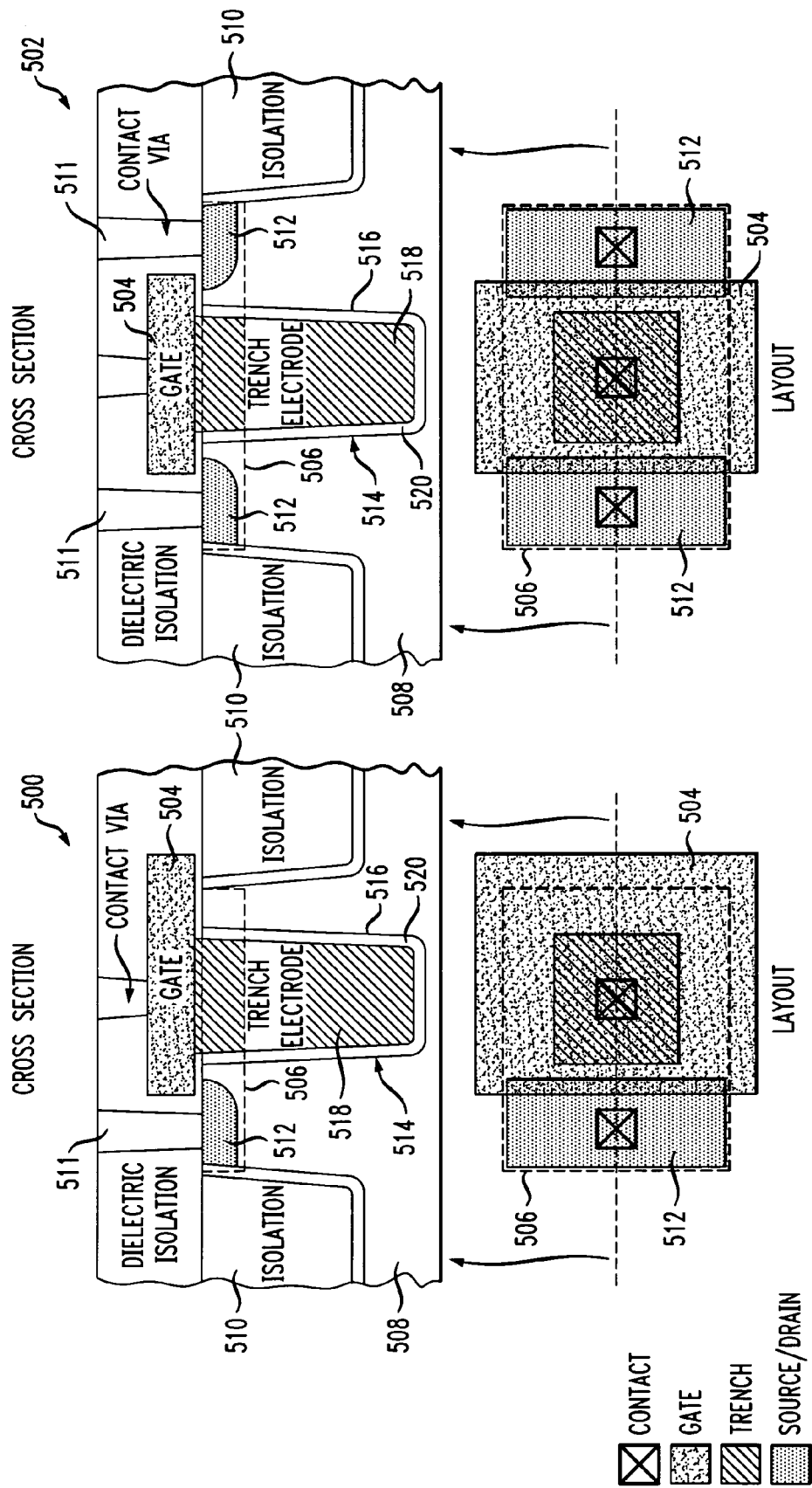
FIG. 5 is a cross-sectional view and corresponding top plan view illustrating two trench gated diode structures, each structure including a planar conductor, formed in accordance with an embodiment of the invention.

FIG. 5 is a cross-sectional view (Cross Section) and corresponding top plan view (Layout) depicting two exemplary gated diode structures, 500 and 502, formed in accordance with an embodiment of the invention. Gated diode structures 500 and 502 are similar to the gated diodes 300, 302 of FIG. 3, with one exception being the addition of a gate electrode 504, or alternative conductive planar structure, to the gated diode structures 500, 502. Specifically, each of gated diodes 500, 502 comprises an active region 506 of a first conductivity type (e.g., n-type) formed in a substrate 508 of a second conductivity type (e.g., p-type). The active region 506 is preferably formed proximate an upper surface of the substrate 508 and is typically bordered by dielectric isolation regions 510 also formed in the substrate proximate the upper surface of the substrate. One or more source/drain regions 512 are formed in the active region 506, such as by using a conventional implant and diffusion process. Gated diode 500 includes a single connection 511 to the source/drain region 512, and gate diode 502 includes multiple connections to the source/drain region.

Like gated diodes 300, 302 shown in FIG. 3, each of gated diodes 500, 502 further includes a trench electrode 514 formed in the substrate 508. The trench electrode 514 comprises a trench 516 formed through the active region 506 and at least partially into the substrate 508. The trench 516 is filled with an electrically conductive material 518, such as, for example, polysilicon, metal (e.g., aluminum), etc, using, for example, a standard deposition or trench fill process. The conductive material 518 in the trench 516 is preferably electrically isolated from the substrate 508 and active region 506 by a thin insulating layer 520, which may comprise a dielectric material (e.g., silicon dioxide, silicon nitride, etc.), formed on sidewalls and a bottom of the trench.

By overlaying a gate electrode 504 over the trench electrode 514 and providing direct contact between the gate electrode and the trench electrode, a planar area surrounding the trench 516 can be more efficiently utilized for additional capacitance. The gate electrode 504 preferably comprises a conductive material, such as, but not limited to, polysilicon, metal (e.g., aluminum), etc. Gated diode structure 502 is similar to a standard MOSFET device, only including the trench electrode 514 through what would otherwise be a channel region of the MOSFET. As in the gated diode structures described in conjunction with FIGS. 3 and 4, alignment of the trench 516 is not critical (does not substantially affect capacitance value) since the entire region surrounding the trench electrode 514 is preferably covered by the gate electrode 504.

Figure 6:
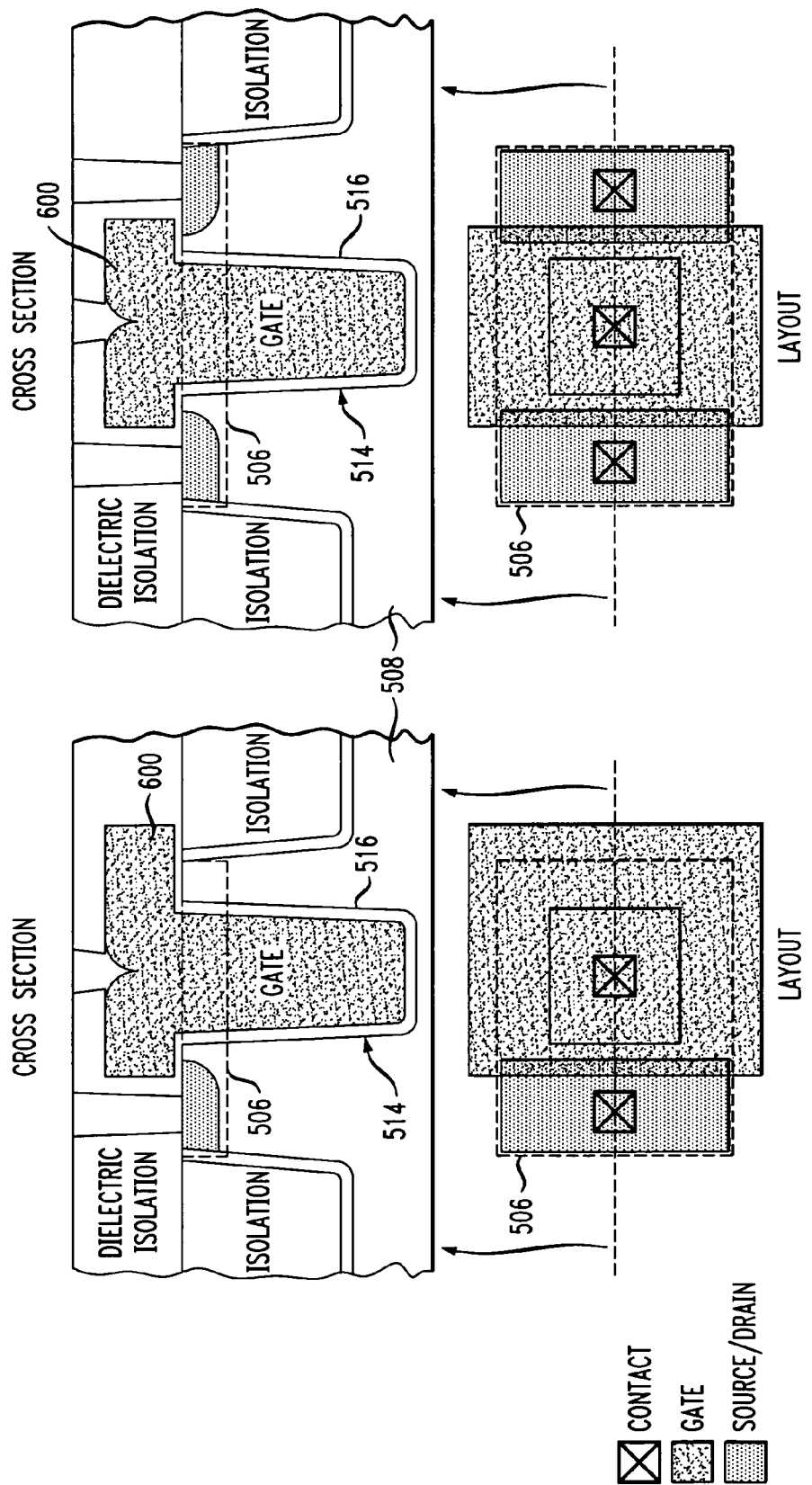
FIG. 6 is a cross-sectional view and corresponding top plan view illustrating two trench gated diode structures, each structure including a trench electrode and a planar conductor formed in a same processing step, in accordance with an embodiment of the invention.

A variant of the illustrative trench gated diode structures 500, 502 is shown in FIG. 6. With reference to FIG. 6, trench gated diode structures 600 and 602 are depicted in which the gate electrode and conductive material filling trench 516 are formed in the same process step. This can be accomplished, for example, by a conformal polysilicon deposition that substantially fills the trench 516 and then extends laterally above an upper surface of the substrate 508 (e.g., substantially parallel to the upper surface of the substrate), beyond an upper perimeter of the trench opening, to form an integrated gate and trench electrode 600. In a standard CMOS process, this would simply require a trench etch for the gated diode prior to gate oxidation. Again, alignment of the trench in gated diode structures 600, 602 is not critical, as long as the trench 516 is formed in the active region 506 of the gated diodes.

Figure 7:
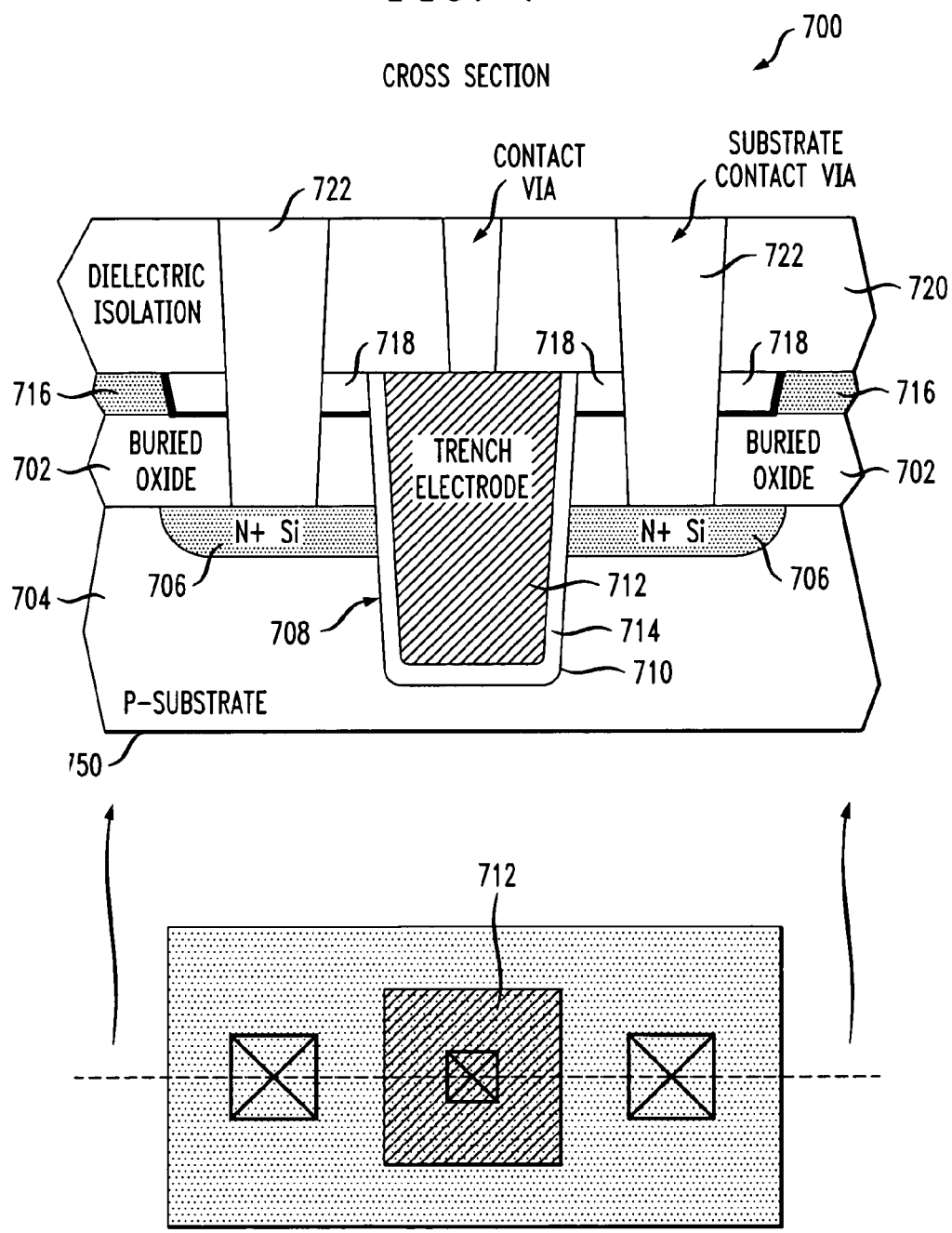
FIG. 7 is a cross-sectional view and corresponding top plan view illustrating a trench gated diode structure including a buried oxide layer, formed in accordance with another aspect of the invention.

FIG. 7 is a cross-sectional view and corresponding top plan view of a trench gated diode 700 formed on a silicon-on-insulator (SOI) substrate, in accordance with another embodiment of the invention. An SOI structure generally includes a buried oxide layer 702 formed on an upper surface of a substrate 704. Buried oxide layer may be formed of silicon dioxide, silicon nitride, etc., or an alternative insulating material. One or more active regions 706 are formed in the substrate 704, proximate the upper surface of the substrate. The active regions 706 may be doped with an impurity (e.g., boron, phosphorus, arsenic, etc.) of a known concentration level, such as by using an implant and diffusion process. In an illustrative embodiment of the invention, active regions 706 are of n-type conductivity and the substrate 704 is of p-type conductivity. The gated diode 700 further includes SOI active regions 716 formed on an upper surface of the buried oxide layer 702. The SOI active regions 716 are separated from one another by SOI isolation regions 718 formed on the buried oxide layer 702. A dielectric isolation layer 720 is preferably formed on at least a portion of an upper surface of the SOI active regions 716 and SOI isolation regions 718. An SOI film comprises SOI active regions 716 and SOI isolation regions 718 formed on buried oxide layer 702.

A trench electrode 708 is preferably formed in the gated diode 700. The trench electrode 708 may be formed in a manner consistent with the trench electrode 309 described above in connection with gated diodes 300, 302 shown in FIG. 3. Specifically, the trench electrode preferably comprises a trench 710 formed at least partially through the buried oxide layer 702. The trench 710 is then filled with an electrically conductive material 712 (e.g., polysilicon, metal, etc.) which is isolated from the buried oxide layer by an insulating layer 714 formed on sidewalls and a bottom of the trench.

As a thickness of the SOI film is thinned, a bottom of the trench 710 may reach the buried oxide, which would eliminate the capacitance along the bottom of the trench. In addition, in advanced CMOS technologies, the heavily doped source and drain regions often extend to the bottom of the SOI layer, which eliminates the sidewall regions that provide inversion capacitance for gated diode behavior. Consequently, the trench 710 in the exemplary gated diode 700 is etched beyond the buried oxide layer 702 and into the substrate 704, so that the gated diode inversion capacitance can be formed below the buried oxide layer. Addition of deep implant into active regions 706, either separately masked or through one or more openings used for forming respective substrate contacts 722, provides effective source/drain electrical contact to the gated diode 700.

Figure 8:
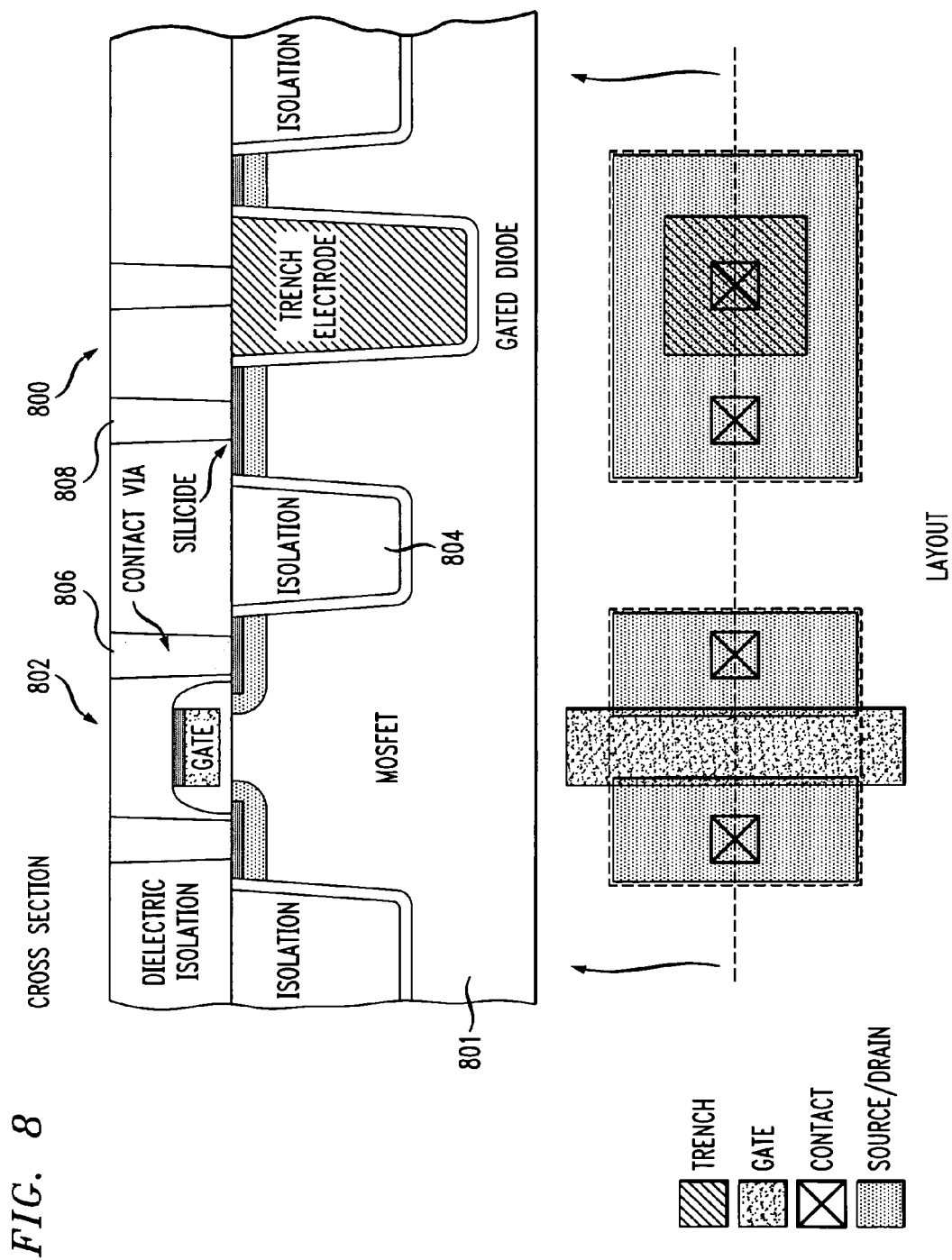
FIG. 8 is a cross-sectional view and corresponding top plan view illustrating a trench gated diode integrated with a series MOSFET device, in accordance with another aspect of the invention.

In a bulk CMOS technology, the series combination of a MOSFET device with a trench gated diode can be as shown in FIG. 8, in accordance with another aspect of the present invention. As apparent from the figure, an exemplary trench gated diode 800 is formed on the same substrate 801 as a corresponding series MOSFET device 802, implemented with a separate isolation region 804 formed between the trench gated diode and MOSFET and having separate contacts 806 and 808. The trench gated diode 800 is formed in accordance with the techniques of the present invention described herein, and the MOSFET device 802 may be formed in a conventional manner, as will be known to those skilled in the art.

Figure 9:
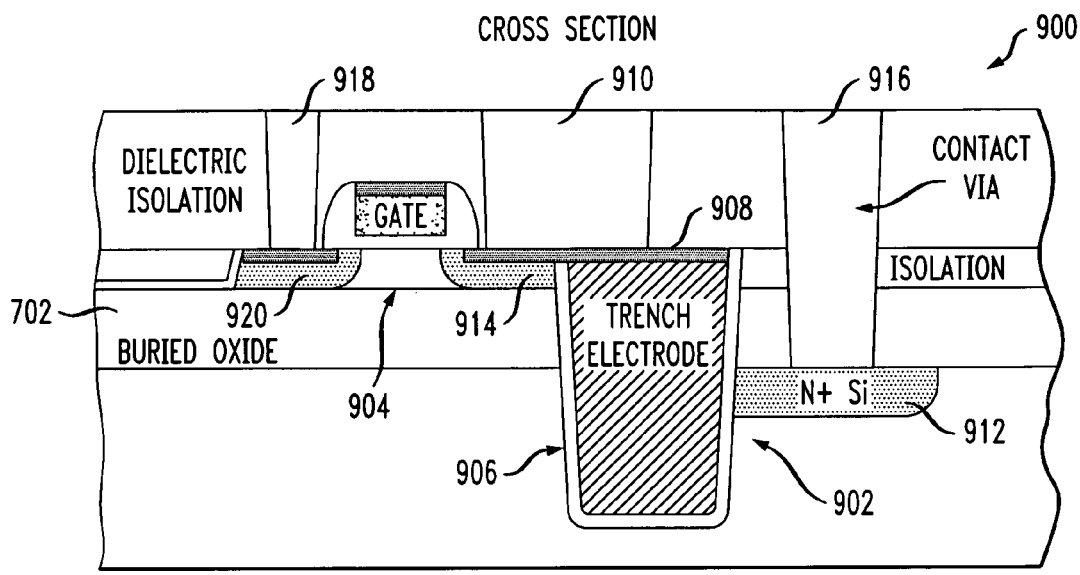
FIG. 9 is a cross-sectional view and corresponding top plan view illustrating a trench gated diode integrated with a series MOSFET device, in accordance with an embodiment of the invention.
Figure 9:
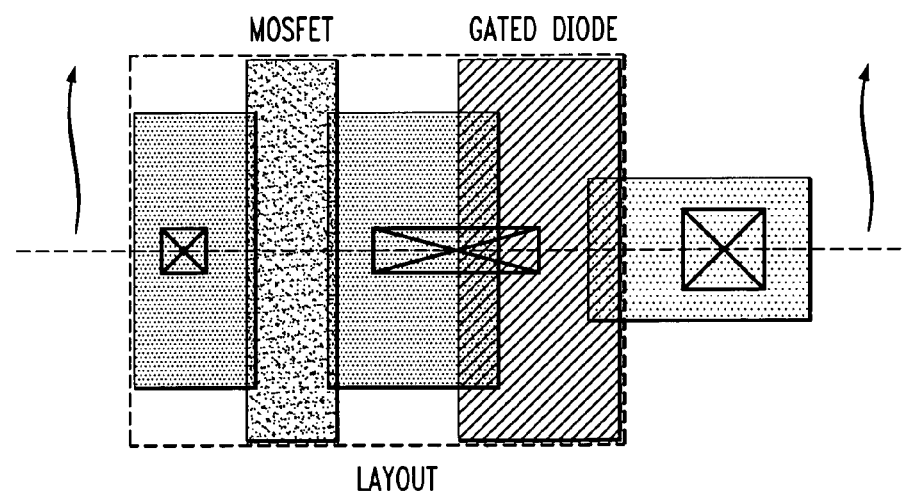
Figure 9:
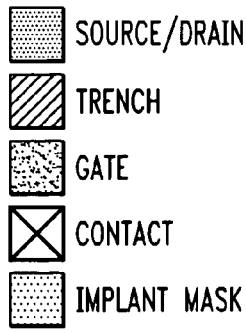

FIG. 9 is a cross-sectional view and corresponding top plan view depicting an exemplary structure 900 comprising a trench gated diode 902 integrated with a series MOSFET device 904. As apparent from the figure, a denser implementation can be achieved, compared to the embodiment of FIG. 8, with an SOI substrate by utilizing the buried oxide layer 702 to provide isolation in a vertical dimension. By etching the trench electrode 906 of the trench gated diode 902 through the buried oxide layer 702 directly adjacent to MOSFET device 904, the gated diode device can be formed beneath the buried oxide layer using a structure similar to that depicted in FIG. 7.

A silicide bridge 908 is preferably formed across an upper portion of the trench electrode 906 and a source/drain region 914 of the MOSFET device 904 for electrically connecting the trench gated diode 902 to the MOSFET device. A common contact via 910 can be used, with or without the silicide bridge 908, for providing electrical connection to a junction of the trench gated diode 902 and MOSFET 904. A second contact via 916 is formed in structure 900 for providing electrical connection to an active region 912 of the trench gated diode 902. A third contact via 918 provides electrical connection to a second source/drain region 920 of the MOSFET 904.

The SOI buried oxide layer 702 provides vertical isolation from the other terminal (e.g., contact via 916) of the trench gated diode 902, such that no separate planar isolation region between the gated diode and the MOSFET 904 is required. The series connection between the MOSFET and trench gated diode is thus formed in a substantially smaller layout area compared to the integrated structure shown in FIG. 8. The device type (e.g., N or P) for either the MOSFET 904 or the trench gated diode 902 (they can be of the same or different types) does not affect the basic device structure, and would only determine the polarity of a block-level implant mask.

Figure 10:
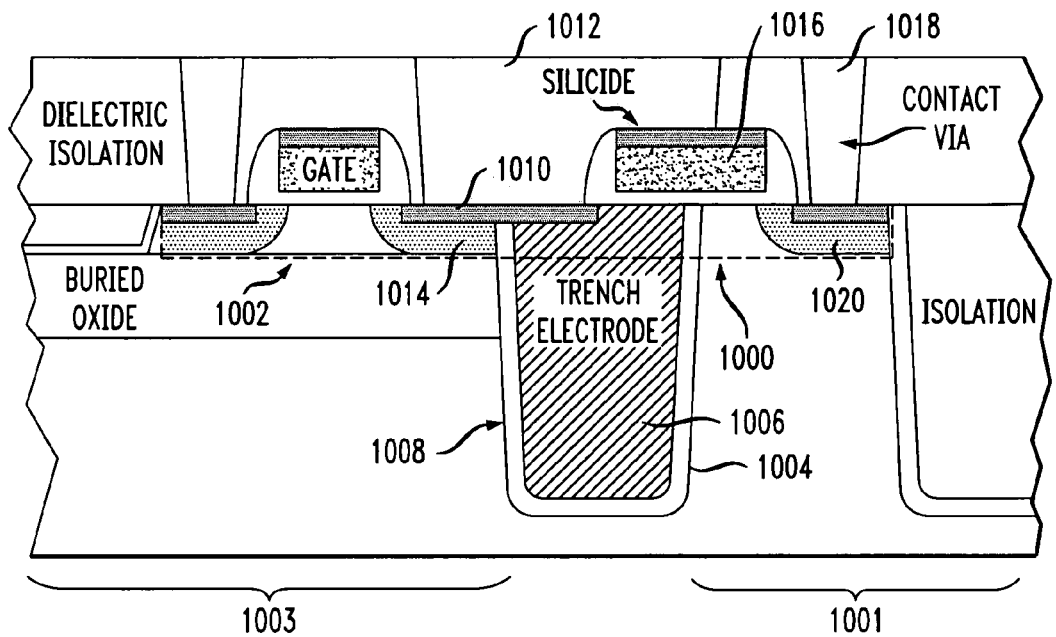
FIG. 10 is a cross-sectional view and corresponding top plan view illustrating a trench gated diode integrated with a series MOSFET device using hybrid orientation technology, in accordance with an embodiment of the invention.
Figure 10:
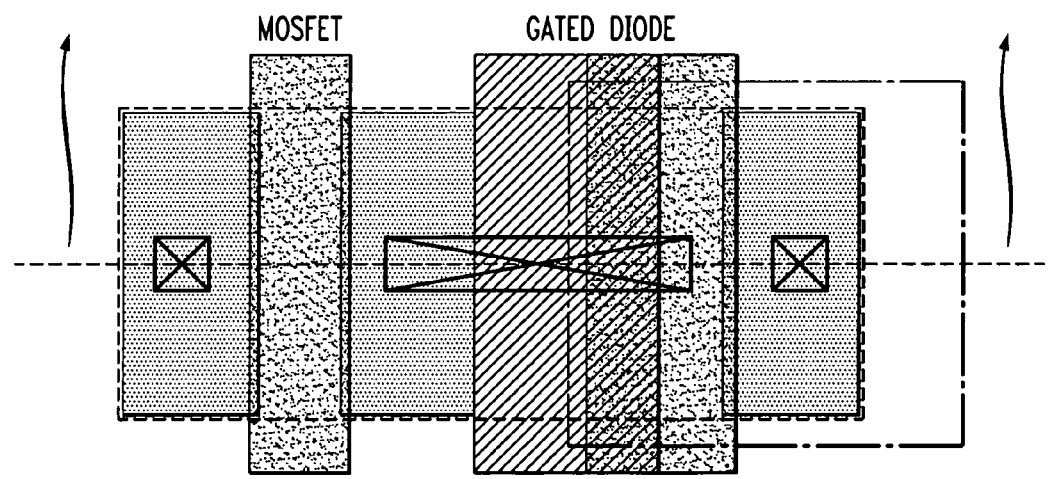

FIG. 10 is a cross-sectional view and corresponding top plan view depicting an exemplary trench gated diode 1000 integrated with a MOSFET 1002 using a standard hybrid orientation technology (HOT), or an alternative process technology which merges SOI and bulk technologies into a partial-SOI substrate, in accordance with another aspect of the invention. With reference to FIG. 10, a structure similar to that shown in FIG. 9 can be achieved without using additional implants or deep substrate contact vias. By filling a bulk STI trench 1004, which would otherwise separate a bulk portion 1001 from an SOI portion 1003 of a chip, with an electrically conductive material 1006, a trench electrode 1008 can be formed. A gated diode is formed along sidewalls and a bottom edge of the trench 1004.

As in FIG. 9, a silicide bridge 1010 and/or contact via 1012 can be used to electrically connect the trench electrode 1008 to an active region 1014 in SOI. A "dummy gate" electrode 1016 is preferably offset to one side of the trench electrode 1008 in order to prevent silicide bridging on that side of the trench electrode. This dummy gate 1016 can be connected to the trench electrode 1008 using, for example, an extension of contact via 1012, or an alternative connection arrangement, and provides more gated diode capacitance around a top corner of trench electrode 1008. A second terminal 1018 of the trench gated diode 1000 is preferably formed by a one-sided active region 1020 on a side of the gate electrode 1016, opposite the MOSFET 1002.

At least a portion of the trench gated diode structures of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A gated diode structure, comprising:
   a semiconductor layer of a first conductivity type;
   an active region of a second conductivity type formed in the semiconductor layer proximate an upper surface of the semiconductor layer;
   at least one trench electrode extending substantially vertically through the active region and at least partially into the semiconductor layer, the at least one trench electrode comprising a trench extending substantially vertically through the active region and at least partially into the semiconductor layer, the trench being substantially filled with an electrically conductive material, the electrically conductive material being isolated from the active region and the semiconductor layer by an insulating layer formed on sidewalls and a bottom of the trench;
   a first terminal electrically connected to the trench electrode;
   at least a second terminal, the second terminal comprising a plurality of terminals electrically connected to the active region at different points throughout the active region; and
   a gate formed proximate the upper surface of the semiconductor layer, the gate extending above and substantially parallel to the upper surface of the semiconductor layer, the gate being electrically connected to the trench electrode, the insulating layer formed on sidewalls and a bottom of the trench extending laterally above an upper surface of the substrate, beyond an upper perimeter opening of the trench, so as to electrically isolate the gate from the active region, the electrically conductive material in the trench being formed substantially concurrently with the gate so that the gate is integrated with the trench electrode;
   wherein the gated diode is operative in one of at least a first mode and a second mode as a function of a voltage potential applied between the first and second terminals, the first mode being characterized by the creation of an inversion layer in the semiconductor layer substantially surrounding the trench electrode, the gated diode having a first capacitance in the first mode and a second capacitance in the second mode, the first capacitance being substantially greater than the second capacitance.

* * * * *